US007052736B2

(12) United States Patent
Wei et al.

(10) Patent No.: US 7,052,736 B2
(45) Date of Patent: May 30, 2006

(54) METHOD FOR DEPOSITING COATINGS ON THE INTERIOR SURFACES OF TUBULAR STRUCTURES

(75) Inventors: Ronghua Wei, San Antonio, TX (US); Christopher Rincon, San Antonio, TX (US); James Arps, San Antonio, TX (US)

(73) Assignee: Southwest Research Institute, San Antonio, TX (US)

( * ) Notice: Subject to any disclaimer, the term of this patent is extended or adjusted under 35 U.S.C. 154(b) by 126 days.

(21) Appl. No.: 10/807,039

(22) Filed: Mar. 23, 2004

(65) Prior Publication Data

US 2004/0191436 A1 Sep. 30, 2004

Related U.S. Application Data

(63) Continuation-in-part of application No. 10/693,076, filed on Oct. 24, 2003, which is a continuation-in-part of application No. 10/167,189, filed on Jun. 11, 2002, now Pat. No. 6,764,714.

(51) Int. Cl.
*B05D 7/22* (2006.01)
*C23C 14/22* (2006.01)

(52) U.S. Cl. ...................... 427/230; 427/472; 427/450; 427/523; 427/237; 427/238; 427/239

(58) Field of Classification Search ................ 427/230, 427/458, 472, 474, 475, 476, 482, 236, 249.1, 427/483, 450, 523, 237, 238, 239, 905, 902, 427/906
See application file for complete search history.

(56) References Cited

U.S. PATENT DOCUMENTS

| | | | | |
|---|---|---|---|---|
| RE30,635 | E | 6/1981 | Kuppers | |
| 4,842,704 | A | 6/1989 | Collins et al. | |
| 5,026,466 | A * | 6/1991 | Wesemeyer et al. | 204/192.38 |
| 5,272,735 | A * | 12/1993 | Bryan et al. | 376/261 |
| 5,478,608 | A | 12/1995 | Gorokhovsky | |
| 5,681,623 | A | 10/1997 | Ferralli | |
| 5,935,391 | A | 8/1999 | Nakahigashi et al. | |
| 6,193,853 | B1 * | 2/2001 | Yumshtyk et al. | 204/192.12 |
| 6,764,714 | B1 | 7/2004 | Wei | |
| 6,767,436 | B1 * | 7/2004 | Wei | 204/192.3 |
| 2003/0228466 | A1 | 12/2003 | Wei | |
| 2004/0115377 | A1 | 6/2004 | Wei | |

* cited by examiner

OTHER PUBLICATIONS

Hosokawa, et al., Self-Sputtering Phenomena in High-Rate Coaxial Cylindrical Magnetron Sputtering. J. Vac. Sci. Technolo., Jan./Feb., 1977. pp. 143-146, vol. 14 No. 1.

*Primary Examiner*—Michael E. LaVilla
(74) *Attorney, Agent, or Firm*—Paula Morris; Morris & Amatong, P.C.

(57) ABSTRACT

A method is disclosed for substantially uniformly coating an interior surface of a ferromagnetic tubular structure such as a ferromagnetic tube having a high aspect ratio. The method entails inducing a magnetic field of a given magnitude within the tubular structure. Further, a bias is applied at a given voltage to the tubular structure. Then, the interior surface of the tubular structure is exposed to a gaseous precursor material under conditions effective to convert a quantity of the gaseous precursor material to ionize gaseous precursor material. The given magnitude and voltage is such that it is effective to deposit the ionized the gaseous precursor material onto the interior surface and converts the ionized gaseous precursor material to a substantially uniform protective coating in the interior surface.

37 Claims, 3 Drawing Sheets

METHOD FOR DEPOSITING COATINGS ON THE INTERIOR SURFACES OF TUBULAR STRUCTURES

CROSS-REFERENCE TO RELATED APPLICATIONS

This application is a continuation-in-part application of U.S. patent application Ser. No. 10/693,076, filed on Oct. 24, 2003 (now pending), which is a continuation-in-part of U.S. patent application Ser. No. 10/167,189, filed on Jun. 11, 2002 now U.S. Pat. No. 6,764,714.

FIELD OF THE APPLICATION

The present application relates to a method of coating a tubular structure, and more particularly, coating an inside surface of the tubular structure.

BACKGROUND OF THE APPLICATION

Deposition of coatings onto the interior surface of tubular structures is needed for various applications, including, but not necessarily limited to gun barrels, automotive cylinder bores, and tubes for special applications.

Tubes with relatively large diameters have been successfully coated using known methods. However, as the diameter of the tube becomes smaller and smaller, it becomes more and more difficult to deposit a substantially uniform coating over the entire interior surface. Most methods simply do not succeed if the aspect ratio (length-to-diameter ratio) of the tube is high.

Effective and economical methods are needed to form substantially uniform coatings on interior surfaces of tubes with a high aspect ratio.

SUMMARY OF THE APPLICATION

In one aspect of the application, a method of substantially uniformly coating an interior surface of a tubular structure (e.g., a ferromagnetic tube having a high aspect ratio) entails inducing a magnetic field of a given magnitude within the tubular structure. Further, a bias is applied at a given voltage to the tubular structure. Then, the interior surface of the tubular structure is exposed to a gaseous precursor material under conditions (e.g., voltage, pressure, bias frequency, etc.) effective to convert a quantity of the gaseous precursor material to ionize gaseous precursor material. The given magnitude and voltage is such that it is effective to deposit the ionized the gaseous precursor material onto the interior surface and converts the ionized gaseous precursor material to a substantially uniform protective coating in the interior surface.

Preferably, the tubular structure is positioned relative to a magnetic field source, (e.g., a magnetic assembly) such that the magnetic field is generated from within the tubular structure. In yet another aspect of the application, the tubular structure is one having a high aspect ratio and/or comprising of a ferromagnetic material. Moreover, the method may include a step of exposing the interior surface of the tubular structure to an inert gas prior to exposing the interior surface to gaseous precursor material. In this way, the interior surface is cleaned (e.g., sputter cleaning) prior to coating.

In a further aspect of the application, a tubular structure is provided. The tubular structure is formed of a ferromagnetic material and comprises an outside surface, an inside surface and a gaseous deposition product substantially uniformly coating the inside surface. Moreover, the tubular structure has an aspect ratio of at least about 3.

DETAILED DESCRIPTION

Figure 1A:
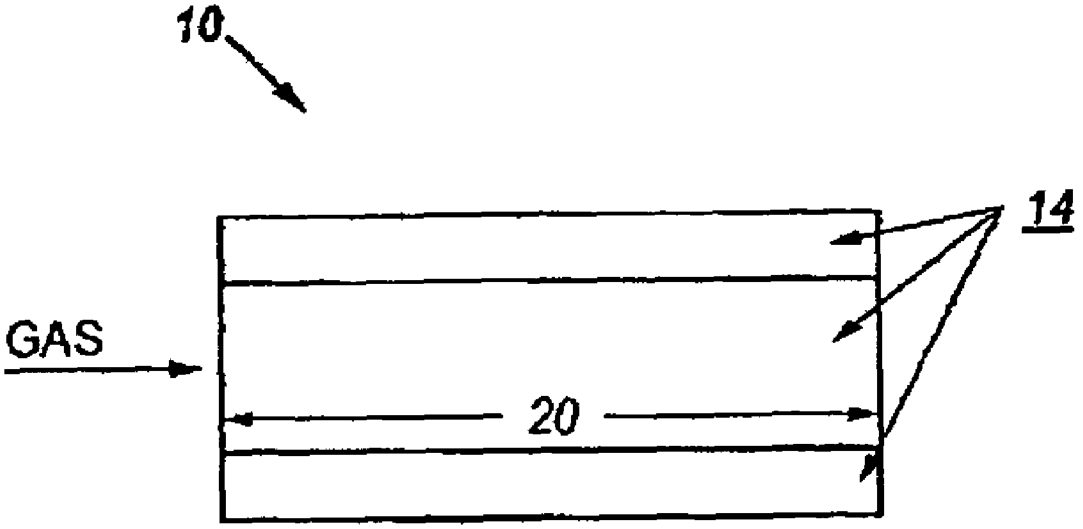
FIG. 1 is a schematic of a setup for depositing a coating on an interior surface of a high aspect ratio tube.
Figure 1B:
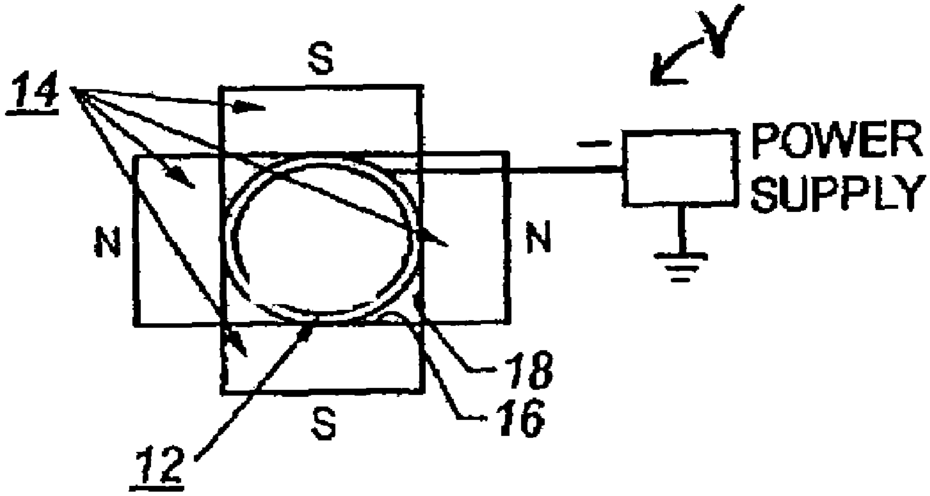
Figure 2:
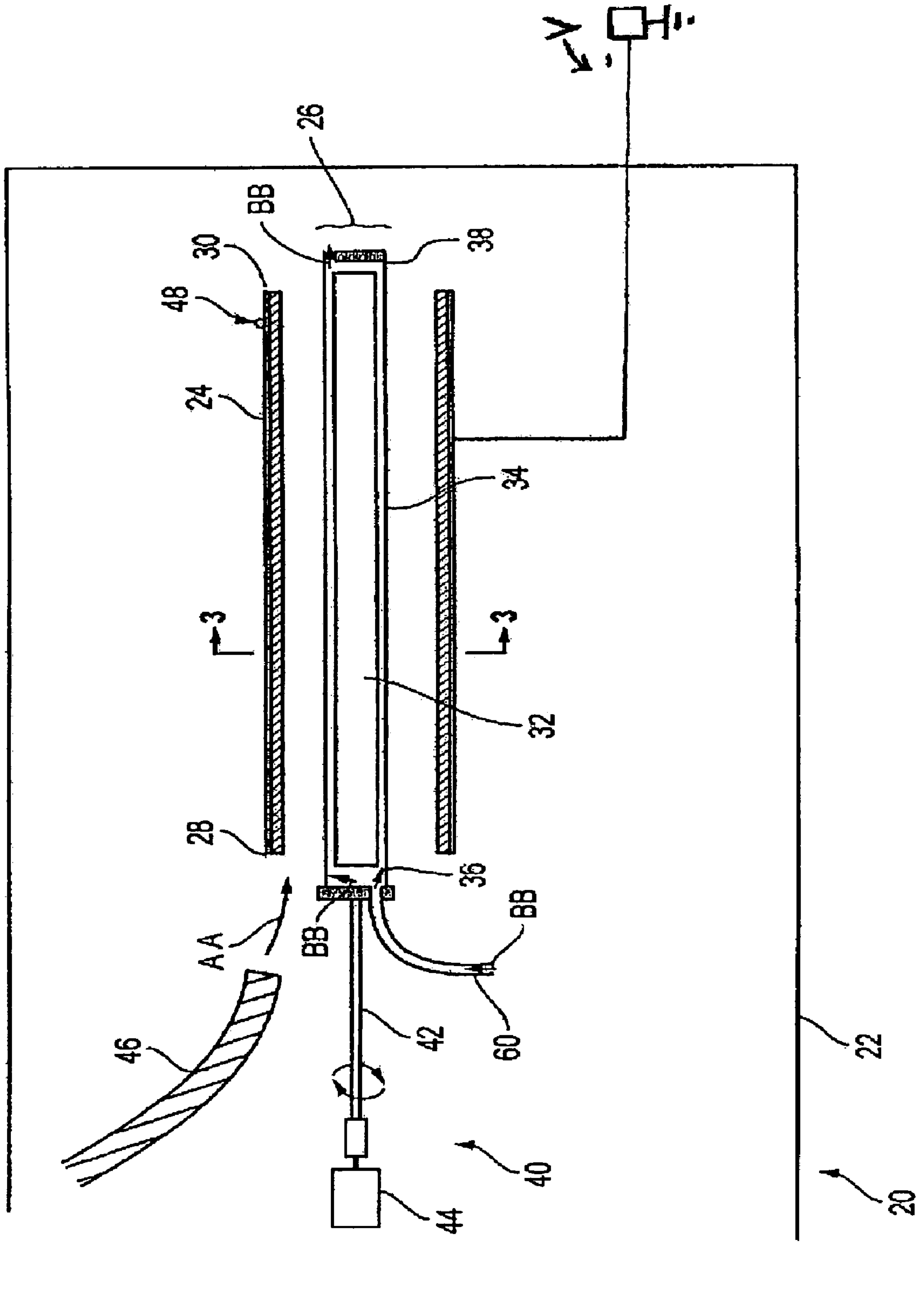
FIG. 2 is a schematic of a setup for depositing a coating on a high aspect ratio tube, according to the present application.

Each of FIGS. 1–3 depict an apparatus suitable for use to deposit a coating on an inside surface of a tubular product. FIG. 1 depicts an apparatus suitable for use to deposit a coating on an inside surface of a tubular product by inducing a magnetic field around the tubular structure. The apparatus and method of coating (e.g., employing the apparatus) are discussed herein to provide background and to facilitate description. The apparatus of FIGS. 2 and 3 are particularly suited for use to deposit a coating on an inside surface by inducing a magnetic field within the tubular structure.

The present application provides a method for coating the interior surface of a tubular structure ("tube"), preferably a tube of ferromagnetic materials or non-ferromagnetic materials having a "high aspect ratio." A "high aspect ratio" is defined herein as an aspect ratio that is sufficiently high that previous techniques for depositing coatings from gaseous precursor materials have been unable to produce a substantially uniform coating on the interior surface of the tubular structure. Typically, a high aspect ratio is a ratio of length: diameter of about 3 or more, preferably about 6 or more.

According to the present application, a substantially uniform coating is formed on the interior surface of tubular structures. As used herein, a "substantially uniform coating" refers to the interior surface being completely covered by a coating having a desired thickness, preferably, a coating having a uniformity of thickness of about +/−20% or less of the desired coating thickness along its length. Glow discharge deposition is used to form the substantially uniform coating on the interior surface of the tubular structures. Specifically, a magnetic field enhanced plasma deposition technique known as plasma enhanced chemical vapor deposition (PECVD) is used in forming coatings of the present application. The application is not limited to coating the interior surface of tubular structures with a high aspect ratio; however, a preferred embodiment is to coat the interior surface of a tubular structure having a high aspect ratio.

The tubular structure may be comprised of substantially any material. The procedure takes place at relatively low temperatures, so thermal sensitivity is not an issue. Hence, the procedure is useful to coat materials that withstand high temperatures, such as ceramics, stainless steel, and other metal alloys, and to coat thermally sensitive materials, such as plain carbon steels and polymers. Depending on the applied voltage and pulse frequency, coatings may be formed at temperatures as low as about 100° C., or as high as about 500° C.

Referring to FIG. 1, a tube 12 is placed in the center of a magnetic field of at least about 1000, preferably about 3000 Gauss. In the embodiment shown in FIG. 1, the magnetic field is derived from four elongated rectangular magnets 14 spaced around the circumference of the tube (1*b*) and along the full length 20 of the tube (1*a*). The magnets 14 are positioned around the tube so that the magnetic flux coming out from the interior surface 16 of a magnet will go into the interior surface 18 of the adjacent magnet to form a complete loop. As a result, the tube 12 is exposed to four quadrants of magnetic fluxes wherein the magnetic field lines are perpendicular to and penetrate through the tube wall. To increase the circumferential uniformity, a motor can be used to rotate either the magnets or the tube. Persons of ordinary skill in the art will recognize that the magnetic field may be derived from any number of magnets capable of being spaced around the circumference of a tube, and thus, the tube may be exposed to any number of quadrants of magnetic fluxes. Persons of ordinary skill in the art will also recognize that other arrangements of magnets, such as a cylindrical magnet that completely surrounds the tube, also would produce a magnetic field that forms a complete loop. Such equivalent arrangements are encompassed by the present application.

The entire setup 10 is placed in a vacuum chamber (not shown). Preferably, the interior surface of the tubular structure is first cleaned to remove superficial contaminants. An inert gas, such as argon gas, is backfilled into the chamber to a pressure of about 0.5 to about 100 millitorr, preferably about 15 millitorr. A pulse frequency of from about 1 Hz to about 20 kHz, preferably from about 2 kHz to about 3 kHz, at a pulse width of from about 5 microseconds to about 40 microseconds, preferably about 20 microseconds, is applied to bias the tube to at least about 200V, preferably about 4 kV (using bias voltage means represented by V in FIG. 1B), for a duration necessary to deposit a coating having the desired thickness. Preferably, from about 5 minutes to about 60 minutes, most preferably for about 30 minutes.

At least for some inorganic substrates, preferably metal alloys, it may be necessary to treat the substrate with an intermediate material in order to form a bonding gradient between the substrate and the carbon in the carbonaceous precursor material. An example of how a metal alloy substrate may be treated to form a bonding gradient includes, but is not necessarily limited to the method described in U.S. Pat. Nos. 5,593,719; 5,605,714; 5,780,119; 5,725,573; 6,087,025; and 6,171,343, incorporated herein by reference. Applying the teachings of these patents to form the present coating on a metal alloy substrate, an interlayer of silicon, is formed in a manner effective to form covalent metal-silicide bonds, and to leave an outer film of silicon. The silicon forms covalent bonds with carbon in the carbonaceous precursor material using the present method. In another embodiment, an interlayer of germanium is formed in a manner effective to form covalent metal-germanide bonds.

In order to form such a bonding gradient, or to form a silicon coating, the gaseous bonding precursor is introduced after the inert gas. In the case of a metal alloy substrate, the gaseous bonding precursor comprises silicon. Suitable silicon-containing gaseous bonding precursors include, but are not necessarily limited to silanes, trimethyl silanes, and the like. In order to introduce the gaseous bonding precursor into the vacuum chamber, the flow of the inert gas is simply halted. The gaseous bonding precursor is introduced at a rate of from about 0 to about 200 standard cubic centimeters per minute (SCCM's), depending upon the pumping speed, and to obtain a pressure of from about 0.5 to about 100 millitorr, preferably from about 10 to about 20 millitorr. A pulse frequency of from about 1 Hz to about 20 kHz, preferably from about 2 kHz to about 3 kHz, at a pulse width of about 5 microseconds to about 40 microseconds, preferably about 20 microseconds, is applied to bias the tube to about 200V, preferably about 4 kV, for a duration necessary to deposit a coating having the desired thickness. Preferably, from about 5 minutes to about 60 minutes, most preferably for about 30 minutes.

The flow of the gaseous bonding precursor is then halted. If a silicon coating is desired, the procedure is complete. If an additional surface coating of amorphous carbon (or another material) is desired, the chamber is back-filled with a selected gaseous precursor material for the surface coating. A most preferred gaseous precursor material is a carbonaceous gaseous precursor, which is backfilled into the vacuum chamber at a rate of from about 1 SCCM to about 200 SCCM, preferably about 40 SCCM, depending upon the flow rate, and to a pressure of from about 0.5 to about 100 millitorr, preferably to about 15 millitorr. A pulse frequency of from about 1 Hz to about 20 kHz, preferably from about 2 kHz to about 3 kHz, at a pulse width of from about 5 microseconds to about 40 microseconds, preferably about 20 microseconds, is applied to bias the tube at about 200V or more, preferably about 4 kV for from about 5 minutes to about 8 hours, preferably for about 3 hours, or until a coating having a desired thickness is produced. A desired thickness for an amorphous carbon coating is at least about 0.5 micrometers, preferably about 2 micrometers or more, more preferably about 5 micrometers or more, and even more preferably about 15 micrometers or more, depending upon the application. The substrate temperature during deposition is sufficiently low to avoid damaging the substrate and to allow the coating to collect on the substrate. In addition, the coating thickness may increase near the exit point of the tubular structure due to gas pressure plasma density changes near the exit point. In order to avoid an increased coating thickness near the exit point section of the tubular structure, (1) the exit point section may be cut off, or (2) an extension tube, having the same diameter as the tubular structure, may be added to the end of the tubular structure during the coating process.

In each instance, a glow discharge is generated by the gaseous precursor material. Since the magnetic field is very strong inside the tube, electrons generated by the glow discharge experience many collisions before escaping from the tube. Due to their collision with molecules of the gaseous precursor material, a high flux of ionic gaseous precursor material is produced. Since the tube is biased negatively, these ions are drawn to the interior surface of the tube and impinge on the interior surface. The result is a substantially uniform coating, depending upon the gaseous precursor material used.

The method/apparatus is described further with reference to the exemplary setup 20 in FIG. 2. Persons of ordinary skill in the art will understand that many variations may be made to this setup while still remaining within the spirit and scope of the claims.

Referring to the simplified schematic of FIG. 2, the exemplary setup 20 includes a vacuum chamber 22, in which the process of coating the interior surface of a tube 24 is performed. The vacuum chamber 22 houses a magnetic field source in the form of a magnetic assembly 26, support structure 34 for magnetic assembly 26, and a rotation mechanism 40 for notably driving the magnetic assembly 26. The tube 24 is placed at an elevated position and appropriately supported within the vacuum chamber 22. Preferably, the tube 24 is equipped with a ground terminal 48 for use as discussed below. The magnetic assembly 26 is positioned within the tube 24 and runs lengthwise from a first end 28 of the tube 24 to a second end 30. The magnetic assembly 26 provides an elongated magnet 32, retained by a suitable elongated, preferably tubular, support structure 34. The elongated magnet(s) 32 is positioned within the support structure 34 and runs lengthwise from a first end 36 of the support structure 34 to a second end 38. The rotation mechanism 40, including a drive shaft 42 and motor 44, is rotatably coupled to a first end of the magnetic assembly 26.

The setup 20 also includes a coolant source 60 for introducing coolant BB into the support structure 34 and about the magnetic assembly 26. Furthermore, the setup 20 provides a gas (precursor) delivery hose 46 that is positioned near the first end of the tube 24 and for communication of gas (precursor) Aa into the inside of the tube 24.

Figure 3B:
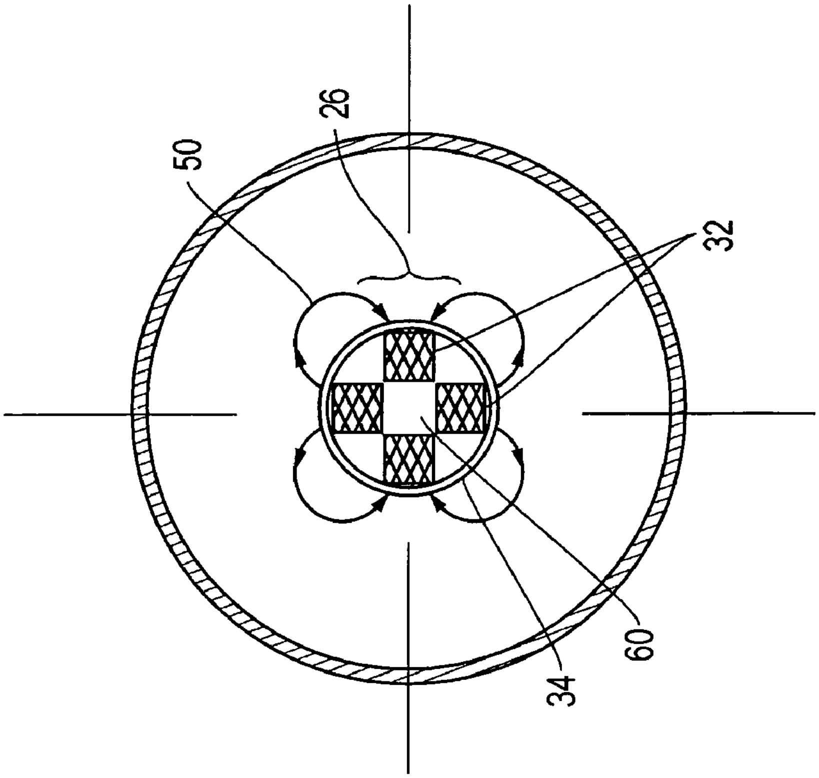
FIG. 3*b* is a cross-sectional view of an alternate magnetic assembly suitable for use with the present application.
Figure 3A:
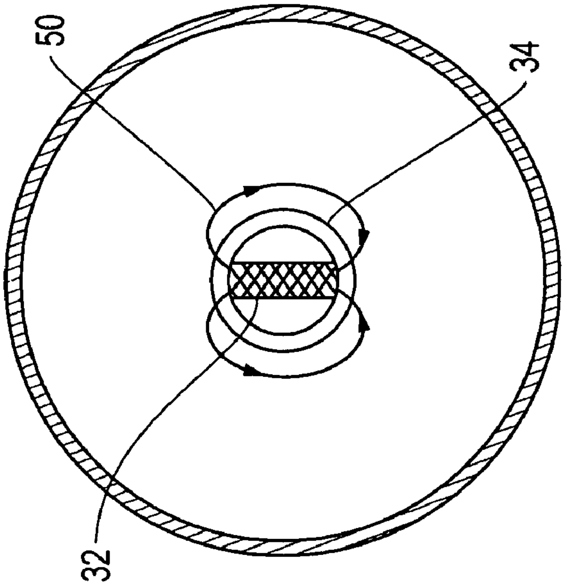
FIG. 3*a* is a cross-sectional view along line 3—3 in FIG. 2, further illustrating a magnetic assembly suitable for use with the present application.

As the magnetic assembly 26 is placed within the tube 24, the support structure 34 centers the elongated magnet(s) 32 within the tube 24. The elongated magnet(s) 32 generate a magnetic field 50 within the tube 24, as shown in FIG. 3*a*. In this embodiment, the magnetic field 50 generated has a magnitude of at least about 1000 Gauss, preferably about 3000 Gauss and higher. The elongated magnet(s) 32 are further positioned so that the magnetic field 50 has the same direction for each elongated magnet 32. As will be understood by one skilled in the art having the present disclosure, the magnetic assembly 26 can include a large number of small magnets. [rotation]

Preferred tubes include, but are not necessarily limited to ferromagnetic materials and non-ferromagnetic materials. Non-ferromagnetic materials include, but are not necessarily limited stainless and aluminum. Ferromagnetic materials are metals that are strongly attracted to magnets. Suitable, ferromagnetic materials include but are not necessarily limited to materials containing iron, nickel, or cobalt and compounds containing these elements. Ferromagnetic compounds include, but are not necessarily limited to, ferrites (ceramic material containing compounds of iron and nickel).

In one embodiment, at least one elongated magnet is placed within the tube to induce a magnetic field within the tube. Suitably, any number of elongated magnets may be used. For example, a plurality of magnets may be employed to accommodate a large diameter tube 24, as depicted in FIG. 3*b*. In this embodiment, the polarities of each of the magnets 32 are arranged so that they enhance each other (as illustrated in FIGS. 3*a* and 3*b*). The magnets 32 can be positioned as a ferromagnetic material such as pure iron or carbon steel. For instance, one magnet (see FIG. 3*a*) will generate two poles (north and south), four magnets will generate four poles. Suitably, the support structures are made from non-ferromagnetic materials. Preferred support structures are made from materials including, but not necessarily limited to stainless steel, copper, or aluminum.

Sputter Cleaning of Inner Diameter of Tube

The entire setup 20 is placed in a vacuum chamber (not shown). Preferably, the interior surface of the tube is first cleaned to remove superficial contaminants. An inert gas, such as argon gas, or a combination of argon gas and $H_2$ is backfilled into both the chamber and the tube to a pressure of about 0.5 to about 100 millitorr, preferably about 15 millitorr. In one method, as the magnetic assembly is grounded to the vacuum chamber, a pulse frequency of from about 1 Hz to about 20 kHz, preferably from about 2 kHz to about 3 kHz, at a pulse width of from about 5 microseconds to about 40 microseconds, preferably about 20 microseconds, is applied to negatively bias the tube (using a bias voltage means such as V in FIG. 2) to at least about 200V, preferably about 4 kV, for a duration necessary to generate plasma within the tube. Preferably, from about 1 minute to go most preferably for about 30 minutes. Herein, Ar ions are drawn to the inner surface of the tube resulting in sputter cleaning. The use of argon and a reactive gas such as $H_2$ allows for effective removal of oxides and other organic contaminants from the inner diameter of the tube.

In another method, the tube is grounded to the vacuum chamber, a pulse frequency of from about 1 Hz to about 20 kHz, preferably from about 2 kHz to about 3 kHz, at a pulse width of from about 5 microseconds to about 40 microseconds, preferably about 20 microseconds, is positively applied to bias the magnetic assembly to at least about 200V, preferably about 4 kV, for a duration necessary to generate plasma within the tube. Similarly, Ar ions are drawn to the inner surface of the tube resulting in sputter cleaning.

Depositing Coating onto Inner Diameter of Tube

In order to form a bonding gradient, or to form a coating onto the inner diameter of the tube, a gaseous bonding precursor is introduced after the inert gas. Suitable silicon-containing gaseous bonding precursors include, but are not necessarily limited to silanes, trimethyl silanes, and the like. Other suitable gaseous bonding precursors include but are not necessarily limited to $CH_4$, $C_2H_2$, $N_2$ or $Cr(CO)_6$. When combinations of $SiH_4$, $CH_4$, $C_2H_2$, $N_2$ or $Cr(CO)_6$ are introduced, a coating containing silicon, silicon nitrides, silicon carbides, diamond-like carbon (DLC) and carbonitrides can be obtained. In order to introduce the gaseous bonding precursor into the vacuum chamber, the flow of the inert gas is simply halted.

In one embodiment, suitable conditions effective to convert a quantity of the gaseous precursor material to ionized gaseous precursor material include the gaseous bonding precursor being introduced at a rate of from about 0 to about 200 standard cubic centimeters per minute (SCCM's), depending upon the pumping speed, and obtaining a pressure of from about 0.5 to about 100 millitorr, preferably from about 10 to about 20 millitorr. A negative voltage having a pulse frequency of from about 1 Hz to about 20 kHz, preferably from about 2 kHz to about 3 kHz, at a pulse width of about 5 microseconds to about 40 microseconds, preferably about 20 microseconds, is applied to bias the tube to about 200V, preferably about 4 kV, for a duration necessary to deposit a coating having the desired thickness. Preferably, from about 5 minutes to about 60 minutes, most preferably for about 30 minutes. The flow of the gaseous bonding precursor is then halted. If a silicon coating is desired, the procedure is complete. If an additional surface coating of amorphous carbon (or another material) is desired, the chamber is back-filled with a selected gaseous precursor material for the surface coating.

In another embodiment, a pulse frequency of from about 1 Hz to about 20 kHz, preferably from about 2 kHz to about 3 kHz, at a pulse width of about 5 microseconds to about 40 microseconds, preferably about 20 microseconds, is applied to positively bias the magnet assembly to about 200V, preferably about 4 kV, for a duration necessary to deposit a coating having the desired thickness. Preferably, from about 5 minutes to about 60 minutes, most preferably for about 30 minutes. Both the sputter-cleaning process and the deposition process can be performed sequentially in order to form a well-adherent coating.

A most preferred gaseous precursor material is a carbonaceous gaseous precursor, which is backfilled into the vacuum chamber at a rate of from about 1 SCCM to about 200 SCCM, preferably about 40 SCCM, depending upon the flow rate, and to a pressure of from about 0.5 to about 100 millitorr, preferably to about 15 millitorr. A pulse frequency of from about 1 Hz to about 20 kHz, preferably from about 2 kHz to about 3 kHz, at a pulse width of from about 5 microseconds to about 40 microseconds, preferably about 20 microseconds, is negatively applied to bias the tube at about 200V or more, preferably about 4 kV for from about 5 minutes to about 8 hours, preferably for about 3 hours, or until a coating having a desired thickness is produced. A desired thickness for an amorphous carbon coating is at least about 0.5 micrometers, preferably about 2 micrometers or more, more preferably about 5 micrometers or more, and even more preferably about 15 micrometers or more, depending upon the application. The substrate temperature during deposition is sufficiently low to avoid damaging the substrate and to allow the coating to collect on the substrate. In addition, the coating thickness may increase near the exit point of the tube due to gas pressure plasma density changes near the exit point. In order to avoid an increased coating thickness near the exit point section of the tube, (1) the exit point section may be cut off, or (2) an extension tube, having the same diameter as the tube, may be added to the end of the tube during the coating process.

To increase the uniformity of the coating, a rotation mechanism may be used to generate a rotation between the tubular structure and the magnet assembly. The rotation mechanism may include any available rotation mechanism capable of rotating the magnetic assembly within the tube. A preferred rotation mechanism includes a motor driven drive shaft.

In order to avoid overheating of the magnets during deposition, water, air or a combination of water and air can be fed into the inner diameter of the tubular structure magnet assembly to cool the elongated magnets. Effective cooling includes reducing the temperature of the magnets by about 100° C., preferably about 150° C., most preferably about 200° C., from an upper temperature of approximately 250° C. In this exemplary method, flexible hose may be used to deliver the coolant to the tube/magnetic assembly. The rotation mechanism may be further configured to rotate alternately in the clockwise and counter clockwise direction so as to prevent entanglement of the hose.

In each instance, a glow discharge is generated by the gaseous precursor material. Since the magnetic field is very strong inside the tube, electrons generated by the glow discharge experience many collisions before escaping from the tube. Due to their collision with molecules of the gaseous precursor material, a high flux of ionic gaseous precursor material is produced. Since the tube is biased negatively, these ions are drawn to the interior surface of the tube and impinge on the interior surface. The result is a substantially uniform coating, depending upon the gaseous precursor material used.

Substantially any coating that can be made using a gaseous precursor material may be made. Preferred coatings include amorphous carbon coatings, metallic coatings, silicon coatings, and ceramic coatings, including but not necessarily limited to oxides, carbides, and nitrides. Most preferred coatings are amorphous carbon coatings, ceramic coatings, metallic coatings, and silicon coatings. If a hydrocarbon gas is used, such as $CH_4$ or $C_2H_2$, an amorphous carbon film forms. If an organometallic gas is used (such as Cr-, Al-, Ti-containing precursors), a metallic or ceramic coating is deposited.

As used herein, the term “amorphous carbon” refers to a carbonaceous coating composed of a mixture of $sp^2$ and $sp^3$ hybridized carbon. $sp^2$ carbon refers to double bonded carbon commonly associated with graphite. $sp^3$ hybridized carbon refers to single bonded carbon. Amorphous carbon does not possess a highly ordered crystalline structure, but generally takes the form of small nanometer sized (or larger) islands of graphite dispersed within an amorphous matrix of $sp^3$ bonded carbon. Amorphous carbon made by the present glow discharge method may be essentially 100% carbon or may have a sizeable amount (up to 50 atomic %) of C—H bonded hydrogen. Amorphous carbon does not usually exist in bulk form, but is deposited as a coating or film by such methods as ion beam assisted deposition, direct ion beam deposition, magnetron sputtering, ion sputtering, chemical vapor deposition, plasma enhanced chemical vapor deposition, cathodic arc deposition, and pulsed laser deposition.

Amorphous carbon are made using a simple hydrocarbon gas, such as methane or acetylene gas, as the carbonaceous precursor. The hydrocarbon gas may comprise other substituents in minor amounts, such as nitrogen, oxygen, and fluorine. Preferably the hydrocarbon gas consists essentially of carbon and hydrogen. A preferred amorphous carbon coating comprises a hardness (nanohardness) of about 15 GPa measured using a nano-indentation hardness tester, a hydrogen concentration of about 32%, and/or a combination thereof.

Diffusion pump fluids also commonly are used as precursor materials for the formation of amorphous carbon. Diffusion pump fluids have a low vapor pressure and can be vaporized stably at room temperature. Examples of diffusion pump fluids which may be modified for use as precursor materials include, but are not necessarily limited to: polyphenyl ether; elcosyl naphthalene; i-diamyl phthalate; i-diamyl sebacate; chlorinated hydrocarbons; n-dibutyl phthalate, n-dibutyl sebacate; 2-ethyl hexyl sebacate; 2-ethyl hexyl phthalate; di-2-ethyl-hexyl sebacate; tri-m-cresyl phosphate; tri-p-cresyl phosphate;o-dibenzyl sebacate. Other suitable precursor materials are the vacuum-distilled hydrocarbon mineral oils manufactured by Shell Oil Company under the trademark APIEZON®, and siloxanes, such as polydimethyl siloxane, pentaphenyl-trimethyl siloxane, and other silicon containing diffusion pump fluids, preferably pentaphenyl-trimethyl siloxane. Preferred diffusion pump fluids include but are not limited to, polyphenyl ether and elcosyl naphthalene. Other suitable carbonaceous precursors contain carbon and other constituent elements, such as oxygen, nitrogen, or fluorine.

A wide variety of gaseous precursors may be used to form metallic or ceramic coatings, as well. Suitable metallic precursors include, but are not necessarily limited to metal carbonyls, metal acetates, and metal alkanedionates, preferably metal pentanedionates. Specific examples include, but are not necessarily limited to tetrakis(dimethylamino)titanium, chromium carbonyls (hexacarbonylchromium), vanadium carbonyls (hexacarbonylvanadium carbonyl), such as erbium III acetate, yttrium 2,4-pentanedionate, erbium 2,4-pantanedionate, and N,N-(dimethylethanamine)-trihydridoaluminum. Preferred gaseous ceramic precursors are silane, trimethyl silane, acetylene, and methane.

In each instance, a glow discharge is generated by the gaseous precursor material. Since the magnetic field is very strong inside the tube, electrons generated by the glow discharge experience many collisions before escaping from the tube. Due to their collision with molecules of the gaseous precursor material, a high flux of ionic gaseous precursor material is produced. Since the tube is biased negatively, these ions are drawn to the interior surface of the tube and impinge on the interior surface. The result is a substantially uniform coating, depending upon the gaseous precursor material used.

The application will be better understood with reference to the following example, which is illustrative only:

EXAMPLE 1

A non-ferromagnetic tube having a length of 16.2 cm and a diameter 1.27 cm (an aspect ratio of 12) was placed in a vacuum chamber. A magnetic assembly was placed lengthwise into the tube. The pressure in the vacuum chamber was pumped to $1.5\times10^{-5}$ torr. A flow of 5 standard cubic centimeters per minute (SCCM) of argon was introduced to a pressure of 15 millitorr. A pulse frequency of 3 kHz with a pulse width of 20 microseconds was applied to bias the tube at 4 kV for about 30 minutes. The argon gas was turned off, and a combination of gases ($SiH_4$, $CH_4$, $C_2H_2$, $N_2$ and $Cr(CO)_6$) was introduced at 57 SCCM to obtain a pressure of 13 millitorr. A pulse frequency of 2 kHz at a pulse width of 20 microseconds was applied to bias the tube at 4 kV for about 30 minutes. The result was a well-bonded, substantially uniform +/−5–6 micrometer coating of silicon, silicon nitrides, silicon carbides, diamond-like carbon and carbonitrides covering the interior surface of the tube.

EXAMPLE 2

A ferromagnetic tube having a length of 17.1 cm and a diameter 1.9 cm (an aspect ratio of 37) was placed in a vacuum chamber. A magnetic assembly was placed lengthwise into the tube. The pressure in the vacuum chamber was pumped to $1.5\times10^{-5}$ torr. A flow of 5 standard cubic centimeters per minute (SCCM) of argon was introduced to a pressure of 15 millitorr. A pulse frequency of 3 kHz with a pulse width of 20 microseconds was applied to bias the magnet assembly at 4 kV for about 30 minutes. The argon gas was turned off, and a combination of gases ($SiH_4$, $CH_4$, $C_2H_2$, $N_2$ and $Cr(CO)_6$) was introduced at 57 SCCM to obtain a pressure of 13 millitorr. A pulse frequency of 2 kHz at a pulse width of 20 microseconds was applied to bias the tube at 4 kV for about 30 minutes. The result was a well-bonded, substantially uniform +/−5–6 micrometer coating of silicon, silicon nitrides, silicon carbides, diamond-like carbon and carbonitrides covering the interior surface of the tube.

Persons of ordinary skill in the art will recognize that many modifications may be made to the methods and compositions described in the present application without departing from the spirit and scope of the present application. The embodiment described herein is meant to be illustrative only and should not be taken as limiting the "invention," which is defined in the claims.

We claim:

1. A method for substantially uniformly coating an interior surface of a tubular structure, said method comprising:

inducing a magnetic field having a given magnitude within the tubular structure;

applying a bias at a given voltage to the tubular structure; and exposing the interior surface to a gaseous precursor material under conditions effective to convert a quantity of the gaseous precursor material to ionized gaseous precursor material, the given magnitude and voltage being effective to deposit the ionized gaseous precursor material onto the interior surface and to convert the ionized gaseous precursor material to a substantially uniform protective coating on the interior surface.

2. The method of claim 1, further comprising positioning a tubular structure relative to a magnetic field source such that the magnetic field is generated from within the tubular structure.

3. The method of claim 2, wherein said positioning includes providing a tubular structure having a ratio of length: diameter of about 3 or more.

4. The method of claim 2, wherein said positioning includes providing a tubular structure comprising ferromagnetic material.

5. The method of claim 2, wherein said positioning includes positioning a magnetic assembly, as the magnetic field source, within the tubular structure and generating the magnetic field therefrom.

6. The method of claim 5, wherein said positioning comprises positioning a plurality of magnets within and along the length of the tubular structure, and said inducing comprises, generating a plurality of magnetic fields having the same direction.

7. The method of claim 1, further comprising exposing the interior surface of the tubular structure to inert gas under conditions effective to clean the interior surface prior to exposing the interior surface to gaseous precursor material and after inducing a magnetic field.

8. The method of claim 7, wherein said gas is argon.

9. The method of claim 1, wherein said exposing comprises selecting gaseous precursor material from the group consisting of $SiH_4$; $CH_4$; $C_2H_2$; $N_2$; $Cr(CO)_6$ and combinations thereof.

10. The method of claim 1, further comprising rotating at least one of the tubular structure and the magnetic field source during said exposing.

11. The method of claim 1, further comprising passing coolant during the exposing in the vicinity of said magnetic field source, thereby cooling said magnetic field source.

12. The method of claim 11, wherein said passing includes passing water in the vicinity of said magnetic field source.

13. The method of claim 1, wherein said applying a bias includes applying a positive bias to said magnetic field source.

14. The method of claim 1, wherein said exposing is performed under conditions including a vacuum pressure of from about 0.5 to about 100 millitorr, and a negative voltage having a pulse frequency of from about 1 Hz to about 20 kHz, at a pulse width of about 5 microseconds to about 40 microseconds applied to bias the tubular structure.

15. The method of claim 1, wherein said positioning includes positioning the tubular structure and the magnetic field source within a vacuum chamber, such that said exposing is performed under a vacuum.

16. A method for coating an interior surface of a ferromagnetic tubular structure, said method comprising:

positioning a ferromagnetic tubular structure and a magnetic field source in the vicinity of one another;

operating the magnetic field source to induce a magnetic field of a given magnitude within the tubular structure;

applying a bias at a given voltage to the tubular structure; and exposing the interior surface to a gaseous precursor material under conditions effective to convert a quantity of the gaseous precursor material to ionized gaseous precursor material, the given magnitude and the given voltage being effective to deposit the ionized gaseous precursor material onto the interior surface and to convert the ionized gaseous precursor material to a protective coating along a length of the interior surface.

17. The method of claim 16, wherein said positioning includes providing a tubular structure having a ratio of length:diameter of about 3 or more.

18. The method of claim 16, wherein said positioning includes positioning a magnetic field assembly, as the magnetic field source, within and along a length of the tubular structure and generating the magnetic field therefrom during said inducing.

19. The method of claim 16, further comprising exposing the interior surface of the tubular structure to inert gas, thereby cleaning the interior surface, prior to exposing the interior surface to a gaseous precursor material and after inducing a magnetic field.

20. The method of claim 19, wherein said gas is argon.

21. The method of claim 16, wherein said exposing includes selecting a gaseous precursor material from the group of gaseous precursor materials consisting of $SiH_4$; $CH_4$; $C_2H_2$; $N_2$; $Cr(CO)_6$; and combinations thereof.

22. The method of claim 18, wherein said positioning includes positioning a plurality of magnets within and along the length of the tubular structure, whereby, during the inducing, a plurality of magnetic fields having the same direction are generated.

23. The method of claim 18 further comprising, rotating at least one of the tubular structure and the magnetic field source during said exposing.

24. The method of claim 23 further comprising, passing coolant during exposing in the vicinity of said magnetic field assembly, thereby cooling said magnetic field assembly.

25. The method of claim 24, wherein said passing includes passing water in the vicinity of said magnetic field assembly.

26. The method of claim 18, wherein said applying a bias includes applying a positive bias to said magnetic field assembly.

27. The method of claim 16, further comprising positioning the tubular structure and the magnetic field source within a vacuum chamber, such that said exposing is performed under a vacuum.

28. The method of claim 16, wherein said exposing is performed under conditions including a vacuum pressure of from about 0.5 to about 100 millitorr, and a negative voltage having a pulse frequency of from about 1 Hz to about 20 kHz, at a pulse width of about 5 microseconds to about 40 microseconds applied to bias the tubular structure.

29. A method for substantially uniformly coating an interior surface of a ferromagnetic tubular structure, said method comprising:

positioning a ferromagnetic tubular structure having a high aspect ratio relative to a magnetic field source;

inducing a magnetic field having a given magnitude within the tubular structure by operating the magnetic field source;

applying a bias at a given voltage to the tubular structure; and exposing the interior surface to a gaseous precursor material under conditions effective to convert a quantity of the gaseous precursor material to ionized gaseous precursor material, the given magnitude and the given voltage being effective to deposit the ionized gaseous precursor material onto the interior surface and to convert the ionized gaseous precursor material to a substantially uniform protective coating along a length of the interior surface.

30. The method of claim 29, wherein said positioning includes positioning a magnetic assembly, as the magnetic field source, within and along the length of the tubular structure such that the magnetic field is generated from within the length of the tubular structure.

31. The method of claim 30, further comprising exposing the interior surface of the tubular structure to inert gas to clean the interior surface prior to exposing the interior surface to a gaseous precursor material and after inducing a magnetic field.

32. The method of claim 30, wherein said positioning includes positioning the tubular structure and the magnetic field source within a vacuum chamber, such that said exposing is performed under a vacuum.

33. The method of claim 32, further comprising rotating at least one of the tubular structure and the magnetic field source during said exposing.

34. The method of claim 33, further comprising passing coolant during the exposing in the vicinity of said magnetic field assembly, thereby cooling the magnetic field assembly.

35. The method of claim 33, wherein said applying a bias further includes applying a positive bias to the magnetic field source.

36. The method of claim 29, wherein said exposing includes selecting a gaseous precursor material from the group of gaseous precursor materials consisting of $SiH_4$; $CH_4$; $C_2H_2$; $N_2$; $Cr(CO)_6$; and combinations thereof.

37. The method of claim 32, wherein the ferromagnetic tubular structure has a ratio of length:diameter of about 3 or more.

* * * * *